United States Patent [19]

Kortovich, Jr. et al.

[11] 4,385,939
[45] May 31, 1983

[54] METHOD OF PRODUCING A SINGLE CRYSTAL ARTICLE

[75] Inventors: Charles S. Kortovich, Jr., Euclid; Bruce M. Guenin, University Heights, both of Ohio

[73] Assignee: TRW Inc., Cleveland, Ohio

[21] Appl. No.: 321,052

[22] Filed: Nov. 13, 1981

[51] Int. Cl.³ .............................................. C22F 1/10
[52] U.S. Cl. .......................................... 148/2; 148/3; 148/12.7 N; 148/162; 148/404
[58] Field of Search ................. 148/2, 3, 162, 12.7 N, 148/32, 32.5

[56] References Cited

U.S. PATENT DOCUMENTS 4,116,723 9/1978 Gell et al. ........................ 148/162

Primary Examiner—R. Dean
Attorney, Agent, or Firm—Yount & Tarolli

[57] ABSTRACT

An improved method of producing a nickel-base single crystal superalloy cast article having a refined gamma prime phase disposed in a gamma phase matrix includes casting the single crystal article with a coarse gamma prime phase disposed in a gamma phase matrix. A stress concentration may be formed in a portion of the article. This stress concentration may be of sufficient severity to cause recrystallization upon heating of the single crystal article to a solution heat treatment temperature at which the gamma prime phase can go into solid solution in the gamma phase. To prevent recrystallization from occurring, the severity of the stress concentration is reduced by heating the single crystal article to a recovery temperature which is below the temperature at which recrystallization occurs. Thereafter, the article is solution heat treated to cause the gamma prime phase to go into solid solution with the gamma phase. A refined gamma prime phase is then precipitated in the gamma phase matrix while the single crystal structure of the article is maintained.

6 Claims, 5 Drawing Figures

METHOD OF PRODUCING A SINGLE CRYSTAL ARTICLE

BACKGROUND OF THE INVENTION

The present invention relates to a new and improved method of producing a nickel-base single crystal superalloy cast article.

Nickel base single crystal superalloy articles may be cast with a coarse gamma prime phase dispersed in a gamma phase matrix. In order to improve the morphology of the gamma prime matrix, the single crystal article is subjected to a solution heat treatment. During the solution heat treatment, the article is heated to a temperature which is slightly below the solidus temperature of the article for a sufficient period of time to cause the gamma prime phase to go into solution with the gamma phase. Thereafter, the gamma prime phase is re-precipitated from the gamma phase in refined form. One known method of casting a single crystal article with a coarse gamma prime phase and subsequently solution heat treating the article to form a refined gamma prime phase is disclosed in U.S. Pat. No. 4,209,348.

During the solution heat treatment of a single crystal article, recrystallization of a portion of the article tends to occur in areas where there is an excessive stress concentration, that is areas of high stored energy and dislocation densities. The recrystallization is a result of nucleation of crystals at these areas and substantial growth in the crystals during the solution heat treatment operation. The excessive stress concentration can be due to the entrapment at critical locations of parts of an article by a ceramic mold as it is being cast and/or by mechanical impacts against the cast article. Of course, the recrystallization of the article at areas of stress concentration destroys the single crystal characteristics of the article.

SUMMARY OF THE PRESENT INVENTION

The present invention eliminates recrystallization of single crystal cast articles during solution heat treatment by first subjecting the cast articles to a recovery heat treatment. The recovery heat treatment is performed at a temperature which is below the temperature at which recrystallization occurs. The recovery heat treatment temperature is also below the temperature to which the article must be heated in order to cause the gamma prime phase to go into solid solution in the gamma phase. Therefore, after the recovery heat treatment, the article is solution heat treated by heating it to a temperature which is below the solidus temperature of the article and above the recrystallization and recovery temperatures of the article to cause the gamma prime phase to go into solution with the gamma phase. Thereafter, a refined gamma prime phase is precipitated in the gamma phase matrix while the single crystal structure of the article is maintained.

Accordingly, it is an object of this invention to provide a new and improved method of producing a single crystal article by subjecting the article to a recovery heating operation at a temperature below the recrystallization temperature of the article and then subjecting the article to a solution heat treatment operation to cause the gamma prime phase to go into solid solution with the gamma phase without recrystallization at portions of the article where stresses were concentrated.

BRIEF DESCRIPTION OF THE DRAWINGS

The foregoing and other objects and features of the present invention will become more apparent upon a consideration of the following description taken in connection with the accompanying drawings wherein.

DESCRIPTION OF SPECIFIC PREFERRED EMBODIMENT OF THE INVENTION

Figure 1:
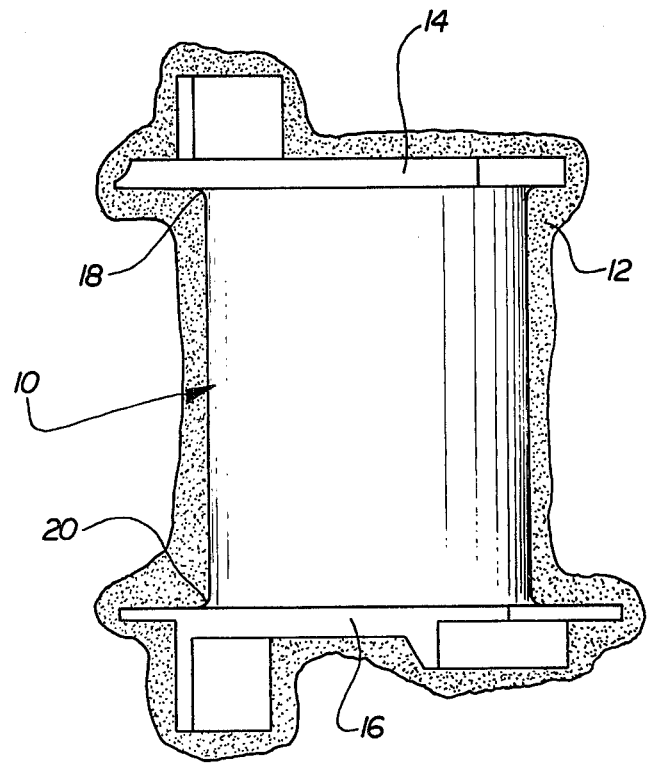
FIG. 1 is a schematic sectional view illustrating the relationship between a single crystal cast article and a ceramic mold.

A single crystal vane or airfoil 10 is illustrated in FIG. 1 in a ceramic mold 12. The single crystal airfoil 10 may be cast from a nickel-base superalloy in a manner similar to that disclosed in U.S. Pat. No. 3,494,709. During casting of the airfoil 10, the portion of the mold 12 between bases 14 and 16 at opposite ends of the airfoil 10 may tend to hold the single crystal airfoil against axial contraction as the airfoil cools. This results in the formation of stress concentrations at fillets 18 and 20. The stress concentrations will be particularly severe at the fillet adjacent to the last base 14 or 16 to cool. This has been assumed herein to be the fillet 18 adjacent to the base 14.

Figure 2:
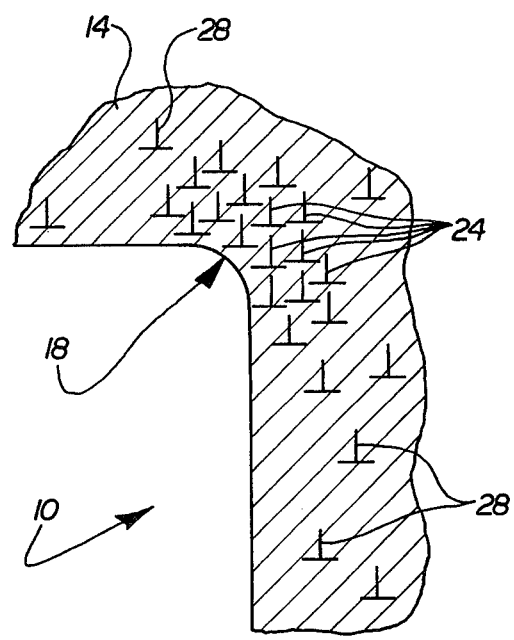
FIG. 2 is a schematic sectional view of a portion of the single crystal article of FIG. 1 and illustrating a region that was highly stressed and where there is a high dislocation density.

The manner in which a stress concentration is formed adjacent to the fillet 18 has been indicated schematically in FIG. 2. When the concentration or level of stress is sufficiently high in the filled region 18, localized permanent (plastic) deformation or an area of high dislocation density result. This area of high dislocation density or cencentration of stresses has been indicated in FIG. 2 by inverted T's 24. Normal areas of density of dislocations have been indicated by the spaced apart inverted T's 28.

Figure 3:
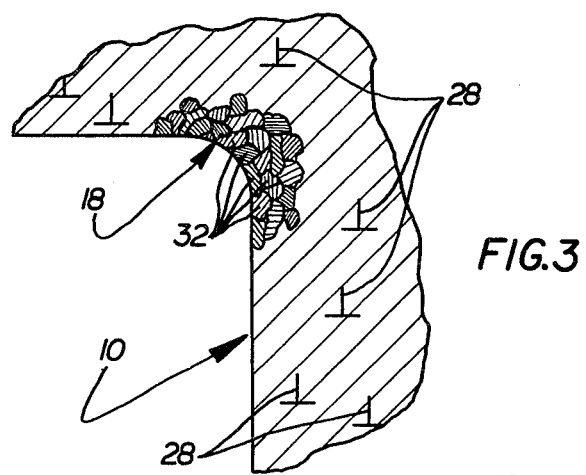
FIG. 3 is a schematic sectional view illustrating how recrystallization occurs at the stress concentration shown in FIG. 2 upon solution heat treatment of the single crystal cast article.

The severe stress concentration at the fillet 18 results in a high density of dislocations at the fillet 18. When the single crystal article 10 is subjected to a solution heat treatment operation to percipitate a refined gamma prime phase in a gamma phase matrix in a manner similar to that disclosed in U.S. Pat. No. 4,209,348, recrystallization occurs adjacent to the fillet 18 in the manner illustrated schematically in FIG. 3. Thus, upon solution heat treatment of the nickel-base single crystal superalloy airfoil 10 to improve the morphology of the gamma phase, crystals 32 are nucleated at the fillet 18 (FIG. 3) where there was an extensive concentration of dislocations 24 (see FIG. 2). The formation of the crystals 32 destroys the single crystal structure of the cast article 10 and may be so detrimental as to require scrapping of the article.

Although the stress concentration has been shown in FIG. 2 as occurring at the fillet 18 due to entrapment of the casting 10 as it cools, it is contemplated that the stress concentration could be due to other causes. For example, an impacting of the cast article against an object during removal of the article from the mold or subsequent cleaning of the article could cause a localized stress concentration leading to localized permanent deformation in the area of the impact. It is contemplated that there may be other factors which could result in stress concentrations to an extent sufficient to result in recrystallization upon solution heat treatment of the airfoil 10. Although the occurrence of recrystallization has been described herein in connection with the airfoil 10, it is contemplated that recrystallization due to the stress concentrations will be a problem in other single crystal articles.

In accordance with a feature of the present invention, recrystallization of the single crystal article 10 during solution heat treatment is prevented by subjecting the article to a recovery heat treatment prior to the solution heat treatment of the article. The recovery heat treatment is conducted at a temperature which is below the temperature at which recrystallization occurs.

In order to effect recrystallization at a stress concentration, the single crystal article must be heated to a sufficiently high temperature to enable recrystallization to occur. The recrystallization temperature is the temperature which the stored energy in an article is released or dissipated by the nucleation and growth of new strain free or unstressed grains or crystals. Of course, the nucleation of these crystals destroys the integrity of the single crystal article. Therefore, the recovery heat treatment is conducted at a temperature below the temperature at which recrystallization occurs to enable the stresses to be relieved without recrystallization.

Figure 4:
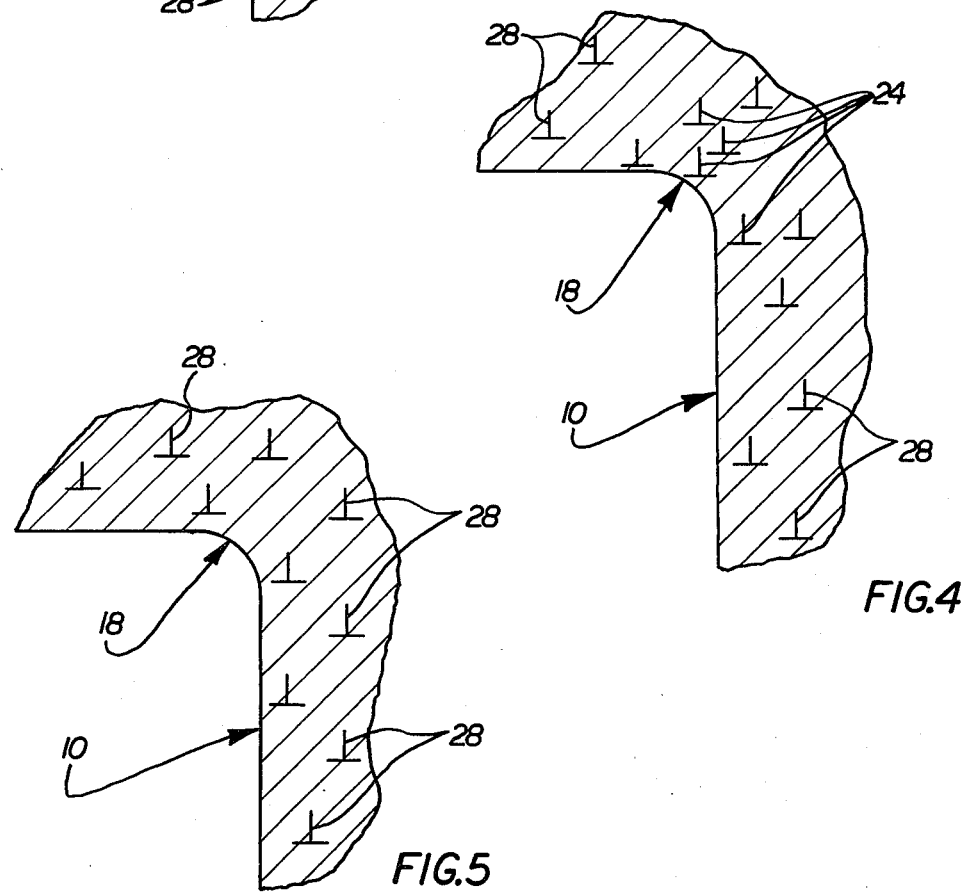
FIG. 4 is a schematic sectional view of the stress concentration of FIG. 2 after the single crystal article has been subjected to a recovery heat treatment at a temperature below the recrystallization temperature of the article.

Thus, in accordance with the present invention, the article 10 having an excessive number of dislocations 24 adjacent to the fillet 18 is subjected to a recovery heat treatment at a temperature below the recrystallization temperature of the article. This recovery heat treatment reduces the dislocation density to a level below the critical density at which recrystallization occurs. When the article 10 is subjected to a recovery heat treatment, the density of dislocations adjacent to the fillet 18 is reduced from the relatively high density shown in FIG. 2 to the relatively low density indicated in FIG. 4. The high dislocation density is relieved due to a diffusion mechanism which results in a reduction of the high energy dislocations adjacent to the fillet 18.

After the density of dislocations adjacent to the fillet 18 has been reduced to a density below the critical density sufficient to cause recrystallization, the airfoil 10 is cooled and subsequently subjected to a solution heat treatment. During the solution heat treatment, the article 10 is heated to a temperature which is below its solidus temperature and above the recrystallization and recovery temperatures of the article. The solution heat treatment causes the gamma prime phase of the article 10 to go into solid solution with the gamma phase.

Figure 5:
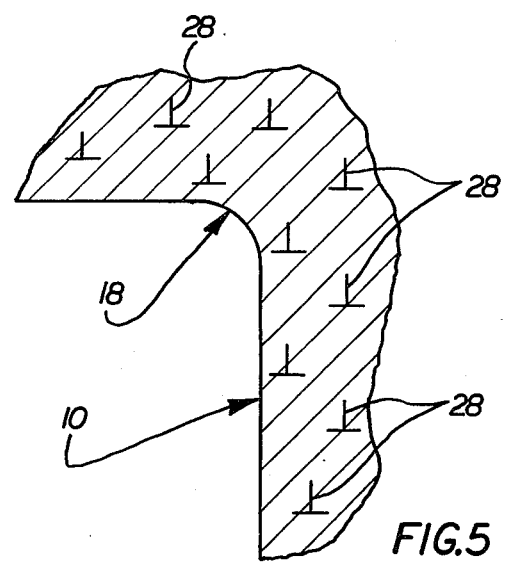
FIG. 5 is a schematic illustration of the portion of the article of FIG. 4 after the article has been subjected to a solution heat treatment.

After the solution heat treatment has been completed, the article is cooled. During a subsequent, aging treatment, the gamma prime phase is reprecipitated in a relatively fine form. Therefore when the solution heat treatment is conducted after a recovery heat treatment, the morphology of the gamma prime phase is improved without recrystallization in areas of stress concentration in the article. This results in the single crystal structure of the article being preserved. After the solution heat treatment and precipitation of the refined gamma prime phase, the dislocation density adjacent to the fillet 18 in the article 10 is generally the same as the other portions of the article in the manner illustrated schematically in FIG. 5. If desired the solution heat treatment can be undertaken without cooking the casing after completion of the recovery heat treatment.

In one experiment a group of 42 castings of single crystal turbine blades were formed of the commercially available nickel-base superalloy, PWA 1480. Of the 42 castings, 20 of them were subjected to a recovery heat treatment at 1800° F. for a period of 24 hours in a pusher-type preheat furnace. After the castings had cooled, both the 20 castings which were subjected to the recovery heat treatment and the remaining 22 castings were subjected to a solution heat treatment at a temperature of approximately 2340° F. which is slightly below the 2355° F. solidus temperature of the metal.

After the solution heat treatment, the 42 castings were inspected. The 20 castings which were subjected to the recovery heat treatment showed no recrystallization. However, the 22 castings which were not subjected to the recovery heat treatment showed a 100% rejection rate due to recrystallization during the solution heat treatment.

In another experiment, three single crystal bars of a nickel-base superalloy, PWA 1480, were masked off into areas $\frac{3}{4}$ of an inch long by $\frac{1}{2}$ inch wide. The single crystal bars were 3 inches long and had a square cross section with $\frac{1}{2}$ inch sides. The bars were subjected to shot peening treatments using 0.023 inch diameter steel shot, Rockwell hardness C50-60 for ten seconds at pressures of 15, 30, 60 and 80 psi.

The bars were then cut into sections and divided into three groups, each of which contained bar sections shot peened at 15, 30, 60 and 80 psi. The first group of bar sections was subjected to a recovery heat treatment at 1800° F. for a period of 24 hours. After a solution heat treatment at a temperature of approximately 2340° F., the bar section subjected to shot peening at 15 psi was free of recrystallized grains. The other three bar sections showed recrystallized grains which increased in number with increasing shot peening pressure. However, the number of these recrystallized grains was far less than what would have occurred if there had been no recovery heat treatment, indicating that substantial stress relief had occurred. It is believed that if the recovery heat treatment had been undertaken for a longer time period, there would have been no recrystallized grains.

The second group of bar sections were subjected to a recovery heat treatment at 1900° F. for a period of 24 hours. After a solution heat treatment at a temperature of approximately 2340° F., the bar sections subjected to shot peening at 15 psi and 30 psi were free of recrystallized grains. The other two bar sections showed recrystallized grains which increased in number with increasing shot peening pressure. The number of recrystallized grains in the bar sections which were shot peened at 60 and 80 psi were fewer than were present in the corresponding bar sections subjected to an 1800° F. recovery heat treatment.

The third group of bar sections were subjected to a recovery heat treatment at 2000° F. for a period of 24 hours. After solution heat treatment at a temperature of approximately 2340° F., the bar section subjected to shot peening at 15 psi was free of recrystallized grains. The other three bar sections appeared to be the same as if they had not been subjected to a recovery heat treatment, that is, they each contained a multitude of recrystallized grains. It is believed that the 2000° F. recovery heat treatment of the three bar sections exceed their recrystallization temperatures.

From the foregoing experiments it is believed that recovery heat treatment at a temperature of approximately 1800° F.–1900° F. is satisfactory for airfoils formed of the commercially available nickel-base superalloy PWA 1480. However, a different nickel-base superalloy could be used if desired. It is believed that there is a range of recovery heat treatment temperatures which will be satisfactory for this alloy and/or other alloys. The extent of this range is not known at the present time. In any case, the recovery heat treatment should be conducted at a temperature which is below the recrystallization temperature of the alloy and, of course, below the solidus temperature of the alloy. Similarly, it is contemplated that the solution heat treatment can be conducted at temperatures other than 2340° F. so long as the solution heat treatment is conducted at a temperatures which is below the incipient melting and solidus temperature of the alloy and above the minimum temperature at which the gamma prime phase enters into solid solution with the gamma phase of the alloy.

In view of the foregoing description it is apparent that the present invention eliminates recrystallization of single crystal cast articles during solution heat treatment by first subjecting the articles to a recovery heat treatment. In one specific instance, a single crystal cast article formed of the nickel-base superalloy PWA 1480 was subjected to a recovery heat treatment at a temperature of 1800° F. This temperature is below the temperature at which recrystallization occurs in the nickel-base superalloy PWA 1480. The recovery heat treatment temperature of 1800° F. was also below the 2340° F. temperature to which the single crystal article formed of PWA 1480 must be heated in order to cause the gamma prime phase to go into solid solution in the gamma phase. After the recovery heat treatment, the article was solution heat treated by heating it to 2340° F. which is below the 2355° F. solidus temperature of the article and above the recrystallization and recovery temperatures of the article to cause the gamma prime phase to go into solution with the gamma phase. Thereafter, a refined gamma prime phase was precipitated in the gamma phase matrix while the single crystal structure of the article was maintained.

Although the article in the foregoing example was formed of the nickel-base superalloy PWA 1480, it is contemplated that the present invention may be practiced in conjunction with other nickel-base superalloys.

It is also contemplated that the recovery and solution heat treatment temperatures other than the 1800° F. and 2340° F. set forth herein may be used.

Having described one specific preferred embodiment of the invention, the following is claimed:

1. A method of producing a nickel-base single crystal superalloy article having a refined gamma prime phase disposed in a gamma phase matrix, said method comprising the steps of casting a nickel-base single crystal superalloy article having a coarse gamma prime phase disposed in a gamma phase matrix, forming in the single crystal article a stress concentration of sufficient severity to cause recrystallization upon heating of the single crystal article to a solution heat treatment temperature at which the gamma prime phase can go into solid solution in the gamma phase, reducing the severity of the stress concentration by heating the single crystal article to a recovery temperature which is below the temperature at which recrystallization occurs in the portion of the article containing the stress concentration, after reducing the severity of the stress concentration, solution heat treating the article by heating the article to a temperature which is below the solidus temperature of the article and above the recrystallization and recovery temperatures to cause the gamma prime phase to go into solid solution with the gamma phase, and, thereafter, precipitating a refined gamma prime phase in the gamma phase matrix while maintaining the single crystal structure of the article.

2. A method as set forth in claim 1 wherein said step of heating the article to a recovery temperature includes heating the article to a temperature of about 1800° F.

3. A method as set forth in claim 1 wherein said step of forming a stress concentration in a portion of the single crystal article includes the step of applying forces to the single crystal article with a mold during casting of the article.

4. A method as set forth in claim 1 wherein said step of forming a stress concentration in a portion of the single crystal article includes the step of impacting against the single crystal article after the article has been cast.

5. A method as set forth in claim 1 wherein said step of solution heat treating the article includes the step of heating the article to a temperature which is above 2300° F.

6. A method as set forth in claim 5 wherein said step of heating the article to a recovery temperature includes the step of heating the article to a temperature of approximately 1800° F.–1900° F. for a period of approximately 24 hours.

* * * * *